(12) United States Patent
Weinberg et al.

(10) Patent No.: US 7,172,919 B2
(45) Date of Patent: Feb. 6, 2007

(54) METHOD FOR FABRICATING A TUNING FORK GYROSCOPE

(75) Inventors: Marc S. Weinberg, Needham, MA (US); Anthony S. Kourepenis, Acton, MA (US); William D. Sawyer, Lexington, MA (US); Jeffrey T. Borenstein, Holliston, MA (US); James H. Connelly, Weymouth, MA (US); Amy E. Duwel, Cambridge, MA (US); Christopher M. Lento, Boston, MA (US); James R. Cousens, Hanson, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 72 days.

(21) Appl. No.: 10/970,067

(22) Filed: Oct. 20, 2004

(65) Prior Publication Data

US 2005/0081631 A1    Apr. 21, 2005

Related U.S. Application Data

(60) Division of application No. 10/264,887, filed on Oct. 4, 2002, now Pat. No. 6,862,934, and a continuation-in-part of application No. 10/004,145, filed on Oct. 23, 2001, now Pat. No. 6,548,321.

(60) Provisional application No. 60/327,450, filed on Oct. 5, 2001, provisional application No. 60/327,434, filed on Oct. 5, 2001.

(51) Int. Cl.
    *H01L 21/00* (2006.01)
(52) U.S. Cl. .......................................... 438/50; 438/51
(58) Field of Classification Search ................. 438/50, 438/51
    See application file for complete search history.

(56) References Cited

U.S. PATENT DOCUMENTS

| | | | |
|---|---|---|---|
| 5,492,596 A | 2/1996 | Cho | |
| 5,911,156 A | 6/1999 | Ward et al. | |
| 5,992,233 A | 11/1999 | Clark | |
| 6,067,858 A | 5/2000 | Clark et al. | |
| 6,155,115 A | 12/2000 | Ljung | |
| 6,250,156 B1 | 6/2001 | Seshia et al. | |
| 6,257,059 B1 | 7/2001 | Weinberg et al. | |
| 6,548,321 B1 | 4/2003 | Sawyer | |
| 6,550,329 B1 | 4/2003 | Watson | |
| 2001/0001928 A1 | 5/2001 | Kikuchi et al. | |
| 2003/0077876 A1 | 4/2003 | Sawyer | |
| 2004/0035206 A1 | 2/2004 | Ward et al. | |

FOREIGN PATENT DOCUMENTS

EP    0 280 905 A2    9/1988

*Primary Examiner*—Evan Pert
(74) *Attorney, Agent, or Firm*—Iandiorio & Teska

(57) ABSTRACT

A method for reducing errors in a tuning fork gyroscope includes determining a first distance, $g_t$, between an upper sense plate and a proof mass and a second distance, $g_b$, between a lower sense plate and the proof mass. The method further includes applying a first voltage, $V_t$, to the upper sense plate and a second voltage, $V_b$, to the lower sense plate, wherein the ratio of the first voltage and the second voltage is a function of the first distance and the second distance.

18 Claims, 8 Drawing Sheets

METHOD FOR FABRICATING A TUNING FORK GYROSCOPE

RELATED APPLICATIONS

This application is a divisional of U.S. patent application Ser. No. 10/264,887 filed Oct. 4, 2002 now U.S. Pat. 6,862,934 entitled TUNING FORK GYROSCOPE which claims the benefit of and priority to U.S. Provisional Application Ser. No. 60/327,450 filed Oct. 5, 2001 and U.S. Provisional Application Ser. No. 60/327,434 filed on Oct. 5, 2001 and which is a Continuation-in-Part of U.S. application Ser. No. 10/004,145 filed Oct. 23, 2001 now U.S. Pat. 6,548,321entitled METHOD OF ANODICALLY BONDING A MULTI-LAYER DEVICE WITH A FREE MASS, each of which are incorporated herein by reference.

FIELD OF THE INVENTION

This invention relates to a tuning fork gyroscope.

BACKGROUND OF THE INVENTION

Tuning fork gyroscopes are used to sense angular displacement in military and commercial (e.g., automotive) environments. In one design, two silicon proof masses (vibrating elements) are suspended above a silicon or glass substrate (or a glass substrate with a silicon layer thereon) and there is a conductive (e.g., metal) sense plate (electrode) on the substrate under each proof mass. The inner and outer edges of each proof mass include combs or electrode fingers. Between the proof masses and adjacent to the outer edge of each proof mass are drive motors and sensors with complementary combs or electrode fingers interleaved with the combs of the two proof masses for oscillating the proof masses along a drive axis, i.e., in the direction of the plane of the substrate. Torque and sense transducers are disposed on the substrate as are conductive leads which interconnect the sense plates, the drive motors, and the transducers.

When subjected to angular displacement, one proof mass moves up and the other proof mass moves down (sense direction). By applying a differential voltage to the two sense plates below the masses, the differential displacement of the two proof masses can be detected as the differential capacitance between the proof masses or as currents flowing from the suspended members. An output signal can then be provided which is indicative of the angular displacement sensed by the gyroscope. See U.S. Pat. No. 5,492,596 incorporated herein by this reference.

Unfortunately, steady state acceleration or gravitational inputs in a direction perpendicular to the plane of the substrate causes both proof masses to move away from the substrate resulting in a scale factor error since the output signal depends on the extent of the air gap between the proof masses and the substrate.

Moreover, tuning fork gyroscopes exhibit bias errors as a result of the motor comb drives imparting forces on the proof masses along the sensing axis. Lift force is caused by the asymmetry where the bottom of the drive combs faces a ground plane while the top sees free space. Nominally, both the left and right outer motors exert forces in opposite directions so that the tuning fork (antiparallel mode) proof mass motion is excited. The left and right outer motor combs are mirror images, so that the left and right motor drives exert parallel drive axis forces, and because of differential sensing, these lift forces tend to cancel out. However, the motor drive to sense axis coupling causes two types of bias errors. First, because of tolerance induced construction asymmetries, the left and right drive axis forces will not be equal so that a differential proof mass motion ensues. A second error ensues because of the contact potential (also known as work function) between the metal conductors and the silicon parts. The contact potential adds roughly 0.25 V to the voltage potential between both sense plates and the proof masses. Thus, the common mode motion induced by drive to sense force coupling causes a current flow from the proof mass. This current is interpreted as a bias error.

Generally, increasing the voltage applied to the sense plates increases the scale factor of these instruments. However, this voltage increase is limited by an effect known as snap down. The applied voltage causes electrostatic forces, which act as a negative spring. For the conventional single-sided design, the forces pull the proof mass toward the sense plate, further increasing the negative spring. At sufficiently high voltages, the negative electrostatic spring overcomes the mechanical stiffness and the proof mass unstably snaps into the sense plates. A voltage that is a fraction, typically ⅓ to ⅔ of the snap down voltage, excites the sense plates.

In general then, the asymmetrical design of the prior art tuning fork gyroscopes with sense plates disposed only under the proof masses has been used successfully in many applications. For additional applications, however, still higher scale factor, lower bias error, better bias stability, and lower sensitivity to linear acceleration are required.

BRIEF SUMMARY OF THE INVENTION

It is therefore an object of this invention to provide a tuning fork gyroscope which is symmetrical in design and includes upper sense plates over the proof masses in addition to the prior art lower sense plates under the proof masses.

It is a further object of this invention to provide such a tuning fork gyroscope which reduces the sensitivity of the scale factor to acceleration.

It is a further object of this invention to provide such a tuning fork gyroscope with increased scale factor and improved sensitivity.

It is a further object of this invention to provide such a tuning fork gyroscope with improved bias magnitude and stability.

It is a further object of this invention to provide such a tuning fork gyroscope which is not dependent on precise manufacturing tolerances and which exhibits improved sensitivity and lower scale factor variation despite varying proof mass/sense plate gaps.

This invention results from the realization that an improved tuning fork gyroscope can be achieved by adding sense plates above as well as below the proof masses thus increasing the scale factor and sensitivity of the gyroscope, and by applying selected voltages to each of the sense plates depending upon the size of the gaps between the sense plates and the proof masses, thus making tight manufacturing tolerances less critical and decreasing the gyroscope's scale factor sensitivity to acceleration.

This invention features a tuning fork gyroscope including a first substrate, a plurality of proof masses including at least first and second proof masses suspended with respect to the first substrate, means for oscillating the proof masses along a drive axis in the direction of the plane of the first substrate; at least first and second sense plates supported by the first substrate, the first sense plate disposed under the first proof mass defining a first nominal gap between the first proof mass and the first sense plate, the second sense plate disposed under the second proof mass defining a second nominal gap between the second proof mass and the second sense plate. A second substrate is spaced from the first substrate and supports at least third and fourth sense plates. The third sense plate is disposed over the first proof mass defining a third nominal gap between the first proof mass and the third sense plate, and the fourth sense plate is disposed over the second proof mass defining a fourth nominal gap between the second proof mass and the fourth sense plate. Means for sensing changes in the nominal gaps between each sense plate and each proof mass provides an output signal indicative of the gyroscope's angular rate about an axis parallel to the substrates.

In a preferred embodiment, the means for sensing includes a first voltage, $V_b$, with $+V_b$ applied to the first sense plate and $-V_b$ applied to the second sense plate, and a second voltage, $V_t$, different from but approximately equal to the first voltage, applied to the third and fourth sense plates, with $-V_t$ applied to the third sense plate and $+V_t$ applied to the fourth sense plate. The first and second nominal gaps may be equal to $g_b$ and the third and fourth nominal gaps may be equal to $g_t$. The ratio of the second and first voltages may be a function of the ratio of nominal gap $g_t$ and nominal gap $g_b$, preferably, $V_t/V_b = g_t^3/g_b^3$.

In another embodiment, the means for sensing may include a first voltage, $V_{bl}$, applied to the first sense plate, a second voltage, $V_{br}$, applied to the second sense plate, a third voltage, $V_{tl}$, applied to the third sense plate and a fourth voltage, $V_{tr}$, applied to the fourth sense plate. The first nominal gap may be $g_{bl}$, the second nominal gap may be $g_{br}$, the third nominal gap may be $g_{tl}$, and the fourth nominal gap may be $g_{tr}$. The ratio of the first and third voltages may be a function of the ratio of the first and third nominal gaps, and the ratio of the second and third voltages may be a function of the ratio of the second and fourth nominal gaps. Preferably, $V_{tl}/V_{bl} = g_{tl}^3/g_{bl}^3$ and $V_{tr}/V_{br} = g_{tr}^3/g_3$ and $V_{tr}$ and $V_{bl}$ are of opposite sign than $V_{tl}$ and $V_{br}$ where $V_{tr}$ and $V_{bl}$ are positive voltages and $V_{tl}$ and $V_{br}$ are negative voltages.

The means for oscillating the proof masses may include motor combs which may be vertically or horizontally split. The tuning fork gyroscope may further include guard bands for controlling out-of-plane sensitivities. The sense plates may be made of metal or of deposited silicon. The tuning fork gyroscope may further include a torsion beam connecting an anchor to a base beam. The torsion beam may be a folded beam, a strain relief chevron beam, or a crab leg. The tuning fork gyroscope may further include at least one torque plate. In one example, the ratio of the first and third voltages is a function of the ratio of the first and third nominal gaps and the ratio of the second and fourth voltages is a function of the second and fourth nominal gaps.

The means for sensing may include applying a voltage to the proof masses and reading currents that appear on the sense plates. The means for sensing may include applying a voltage to the proof masses and reading a weighted summation of output currents on each of the sense plates for eliminating gyroscope sensitivity to vertical displacement. $I_{bl}$ may be the output current that appears on the first sense plate, $I_{br}$ may be the output current that appears on the second sense plate, $I_{tl}$ may be the output current that appears on the third sense plate, and $I_{tr}$ may be the output current that appears on the fourth sense plate. The first nominal gap may be $g_{bl}$, the second nominal gap may be $g_{br}$, the third nominal gap may be $g_{tl}$, and the fourth nominal gap may be $g_{tr}$. The weighted summation of the output currents on each of the sense plates may be $I_{sum}$, where $$I_{sum} = I_{tr} - I_{tl}\left(\frac{g_{tl}}{g_{tr}}\right)^3 + I_{bl}\left(\frac{g_{bl}}{g_{tr}}\right)^3 - I_{br}\left(\frac{g_{br}}{g_{tr}}\right)^3$$

and where $I_{sum}$ is proportional to the input angular rate and does not depend on vertical displacement.

This invention also features a method for reducing errors in a tuning fork gyroscope including determining a first distance, $g_t$, between an upper sense plate and a proof mass and a second distance, $g_b$, between a lower sense plate and the proof mass, and applying a first voltage, $V_t$, to the upper sense plate and a second voltage, $V_b$, to the lower sense plate, wherein the ratio of the first voltage and the second voltage is a function of the first distance and the second distance. The first and second voltages may be DC voltages, or they may be AC carrier excitation voltages. In one example, $V_t/V_b = g_t^3/g_b^3$. The step of determining the first and second distances may include measuring the capacitance between the upper sense plate and the proof mass and the capacitance between the lower sense plate and the proof mass, respectively.

This invention also features a method for reducing errors in a tuning fork gyroscope including first and second proof masses, a left upper sense plate disposed over the first proof mass, a right upper sense plate disposed over the second proof mass, a left lower sense plate disposed under the first proof mass and a right lower sense plate disposed under the second proof mass, including measuring a first distance, $g_{tl}$, between the left upper sense plate and the first proof mass, a second distance, $g_{tr}$, between the right upper sense plate and the second proof mass, a third distance, $g_{bl}$, between the left lower sense plate and the first proof mass, and a fourth distance, $g_{br}$, between the right lower sense plate and the second proof mass; and applying a first voltage, $V_{tl}$, to the left upper sense plate, a second voltage, $V_{tr}$, to the right upper sense plate, a third voltage, $V_{bl}$, to the left lower sense plate, and a fourth voltage, $V_{br}$, to the lower right sense plate, wherein the ratio of $V_{tl}$ and $V_{bl}$ is a function of $g_{tl}$ and $g_{bl}$ and the ratio of $V_{tr}$ and $V_{br}$ is a function of $g_{tr}$ and $g_{br}$. In a preferred embodiment, wherein $V_{tl}$ is not equal to $V_{tr}$ and $V_{bl}$ is not equal to $$V_{br}, \frac{V_{tl}}{V_{bl}} = \frac{g_{tl}^3}{g_{bl}^3} \text{ and } \frac{V_{tr}}{V_{br}} = \frac{g_{tr}^3}{g_{br}^3}.$$

This invention also features a tuning fork gyroscope including a first substrate, at least a first proof mass suspended with respect to the first substrate, means for oscillating the first proof mass along a drive axis in the direction of the plane of the first substrate, at least a first sense plate supported by the first substrate, the first sense plate disposed under the first proof mass defining a first nominal gap between the first proof mass and the first sense plate, a second substrate spaced from the first substrate, at least a second sense plate supported by the second substrate, the second sense plate disposed over the first proof mass defining a second nominal gap between the first proof mass and the second sense plate, and means for sensing changes in the nominal gaps between each sense plate and the first proof mass and for outputting a signal indicative of angular displacement of the gyroscope. The means for sensing may include a first voltage, $V_b$, applied to the first sense plate and a second voltage, $V_t$, different from the first voltage, applied to the second sense plate. The first nominal gap may be equal to $g_b$ and the second nominal gap may be equal to $g_t$. The ratio of the second voltage $V_t$ and first voltage $V_b$ may be a function of the ratio of the second nominal gap $g_t$ and the first nominal gap $g_b$, for example, $$\frac{V_t}{V_b} = \frac{g_t^3}{g_b^3}.$$

This invention also features a method for fabricating a tuning fork gyroscope with upper and lower sense plates, including providing a silicon substrate, etching the silicon substrate to provide at least one recess in the silicon substrate, producing a structure layer having a predetermined thickness, etching the structure layer to provide at least two proof masses, and applying a metal coating to the silicon substrate beneath a portion of each proof mass. The method of fabricating further includes providing a glass substrate, etching the glass substrate to provide at least one recess in the glass substrate, depositing a multimetal layer to the at least one recess, depositing a multimetal layer to the at least one recess, electrostatically bonding the silicon substrate to the glass substrate, and etching the silicon substrate down to the structure layer. The method may include the further step of applying KOH thinning prior to etching the silicon substrate. Producing the structure layer may include diffusing boron onto a surface of the silicon substrate or it may include growing epitaxial silicon with boron onto a surface of the silicon substrate. Diffusing boron onto a surface of the silicon substrate may include diffusing boron-geranium silicon or silicon-on-insulator to define structural thickness. Boron may be diffused into a silicon substrate to define structural thickness.

The proof masses may have a thickness in the range of 5 to 100 µm. The multimetal layer may be chosen from the group consisting of Ti/Pt/Au and Ti/Pt.

In one example, the silicon substrate may include a lightly doped layer and a highly doped epitaxial layer, where the thickness of the highly doped epitaxial layer is between 5 and 100 µm. Etching of the silicon substrate may be by plasma enhanced ion etching. The structure layer may be 5 to 100 µm thick, and is preferably 5 to 20 µm thick. Connecting posts between the silicon substrate and the glass substrate may be defined by reactive ion etching. The recesses in the glass substrate may be approximately 1700 Å deep.

The method for fabricating a tuning fork gyroscope with upper and lower sense plates may further include providing a second glass substrate, etching the second glass substrate to provide at least one indentation in the second glass substrate and depositing at least one metal run in the indentation. The method may further include cutting a gap between the proof mass and the second glass substrate, exposing at least one bonding pad, and bonding the second glass substrate to the structure layer. Exposing the bonding pad may include water drilling.

This invention further features a tuning fork gyroscope including a first substrate, a plurality of proof masses including at least first and second proof masses suspended with respect to the first substrate, means for oscillating the proof masses along a drive axis in the direction of the plane of the first substrate, and at least first and second sense plates supported by the first substrate. The first sense plate may be disposed adjacent the first proof mass defining a first nominal gap between the first proof mass and the first sense plate, and the second sense plate may be disposed adjacent the second proof mass defining a second nominal gap between the second proof mass and the second sense plate. A second substrate is spaced from the first substrate and supports at least third and fourth sense plates. The third sense plate may be disposed adjacent the first proof mass but opposite the first sense plate, defining a third nominal gap between the first proof mass and the third sense plate. The fourth sense plate may be disposed adjacent the second proof mass but opposite the second sense plate defining a fourth nominal gap between the second proof mass and the fourth sense plate. Means for sensing changes in the nominal gaps between each sense plate and each proof mass provides an output signal indicative of the gyroscope's angular rate about an axis perpendicular to the substrates.

In a preferred embodiment, the means for sensing includes a first voltage, $V_b$, with $+V_b$ applied to the first sense plate and $-V_b$ applied to the second sense plate, and a second voltage, $V_t$, different from but approximately equal to the first voltage, applied to the third and fourth sense plates, with $-V_t$ applied to the third sense plate and $+V_t$ applied to the fourth sense plate. The first and second nominal gaps may be equal to $g_b$ and the third and fourth nominal gaps may be equal to $g_t$. The ratio of the second $V_t$ and first $V_b$ voltages is a function of the ratio of the nominal gap $g_t$ and the nominal gap $g_b$, preferably $$\frac{V_t}{V_b} = \frac{g_t^3}{g_b^3}.$$

In another embodiment, the means for sensing may include a first voltage, $V_{bl}$, applied to the first sense plate, a second voltage, $V_{br}$, applied to the second sense plate, a third voltage, $V_{tl}$, applied to the third sense plate, and a fourth voltage, $V_{tr}$, applied to the fourth sense plate. The first nominal gap may be $g_{bl}$, the second nominal gap may be $g_{br}$, the third nominal gap may be $g_{tl}$ and the fourth nominal gap may be $g_{tr}$. The ratio of the first and third voltages may be a function of the ratio of the first and third nominal gaps and the ratio of the second and third voltages may be a function of the ratio of the second and fourth nominal gaps. Preferably, $$\frac{V_{tl}}{V_{bl}} = \frac{g_{tl}^3}{g_{bl}^3} \text{ and } \frac{V_{tr}}{V_{br}} = \frac{g_{tr}^3}{g_{br}^3},$$

and $V_{tr}$ and $V_{bl}$ are of opposite sign than the voltages $V_{tl}$ and $V_{br}$ where $V_{tr}$ and $V_{bl}$ are positive voltages and the voltages $V_{tl}$ and $V_{br}$ are negative voltages. There may be additional sense plates arranged in a comb-like configuration.

The subject invention, however, in other embodiments, need not achieve all these objectives and the claims hereof should not be limited to structures or methods capable of achieving these objectives.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
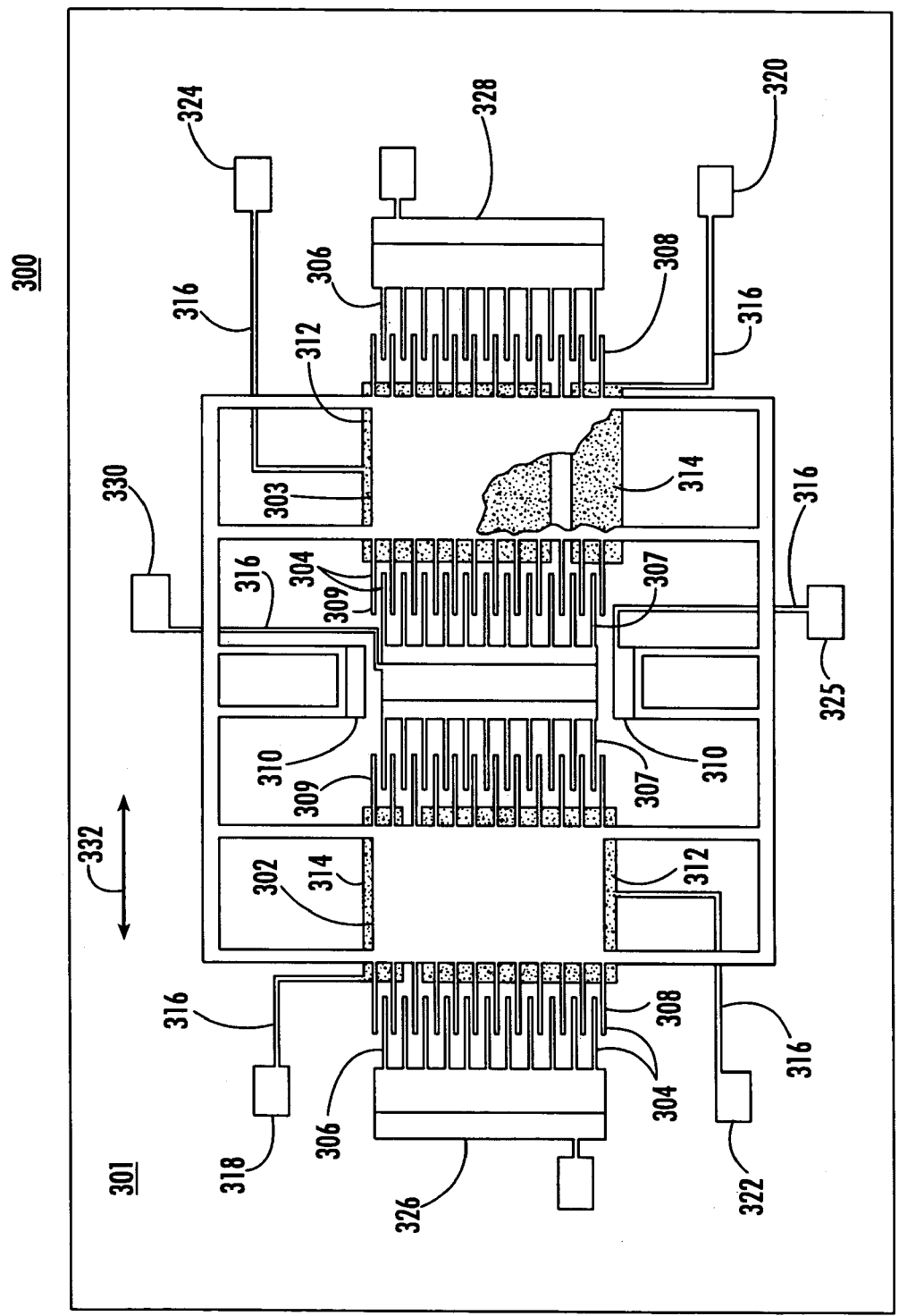
FIG. 1 is a top schematic view of a tuning fork gyroscope according to the prior art.

Prior art tuning fork gyroscope 300, FIG. 1, is also known in the art as a comb drive gyroscope. Gyroscope 300 includes vibrating or proof masses 302 and 303. Interleaved fingers 304, including outer comb drive fingers 306, 307 and inner comb driven fingers 308, 309 impart vibrational motion to vibrating masses 302, 303. The sensed motion is wired to electronics (not shown) that generate the driving voltage so that a self-oscillator is realized. It is known to reverse the role of inner and outer combs. Both solid and horizontally and vertically split inner combs have been used although horizontal splits in both the inner and outer combs are now preferred. Vibrating masses 302, 303 are suspended relative to lower substrate 301 by one or more anchors 310. Sense plates or electrodes 312, 313 and torque electrodes 314 are disposed only beneath a portion of each vibrating mass 302, 303. A plurality of conductive leads 316 interconnect right torque transducer 318, left torque transducer 320, left sense transducer 322, right sense transducer 324 and motor transducer 325 with sense electrodes 312, 313, torque electrodes 314, and left drive motor 326, right drive motor 328 and center drive motor 330.

Prior art gyroscope 300 is driven along the x-axis, shown by vector 332 in FIG. 1, and senses vertical motion (in and out of the plane of the drawing sheet) caused by Coriolis acceleration. Typically, an input rate pushes one proof mass 302 up and the other proof mass 303 down. This differential displacement indicates angular rate. The Coriolis induced displacement typically occurs at 5 to 30 kHz, the frequency at which the x-axis motion is driven. The vertical motion of the proof masses 302, 303 is inferred from measurements of the differential capacitances between the proof masses 302, 303 and sense plates 312, 313.

Steady state acceleration or gravitational inputs along the vertical axis move both proof masses 302, 303 away from the substrate 301. With sense electrodes 312, 313 located only below the proof masses 302, 303 as shown in FIG. 1, these steady state acceleration or gravitational inputs create larger gaps between the sense electrodes and the proof masses, resulting in a scale factor error. In other words, the voltage output for a given input rate depends on the air gap. Depending on the gyroscope's resonant frequencies and design, the scale factor variation may be 300 to 10,000 ppm/g. Steady state acceleration causes only small offset or bias errors which do not depend on the input rate because these low frequency variations in gap are not at the drive frequency. Such errors are rejected during demodulation. Also, steady state acceleration causes common displacement of the proof masses while the desired angular rate inputs cause differential motion. Thus, gyroscopes with sense electrodes only on one side of the proof masses—typically below—as shown in FIG. 1, result in scale factor error.

Also, gyroscopes with sense electrodes only below the proof masses result in bias errors caused by forces along the drive axis 332 that result from the motor drive, a principal source of bias errors in known tuning fork gyroscope designs. Such bias errors can be significant depending on the construction tolerances to which the gyroscopes are made. As noted in the Background section above, both the left and right outer motors exert forces in opposite directions and lift forces tend to cancel out, but the motor drive to sense axis coupling still causes two types of bias errors. The left and right sense axis forces will not be equal so that a differential proof mass motion ensues, because of tolerance induced construction asymmetries. A second error ensues because the contact potential between the metal conductors and the silicon parts causes common mode vertical motion to be sensed as an erroneous angular rate.

Figure 2A:
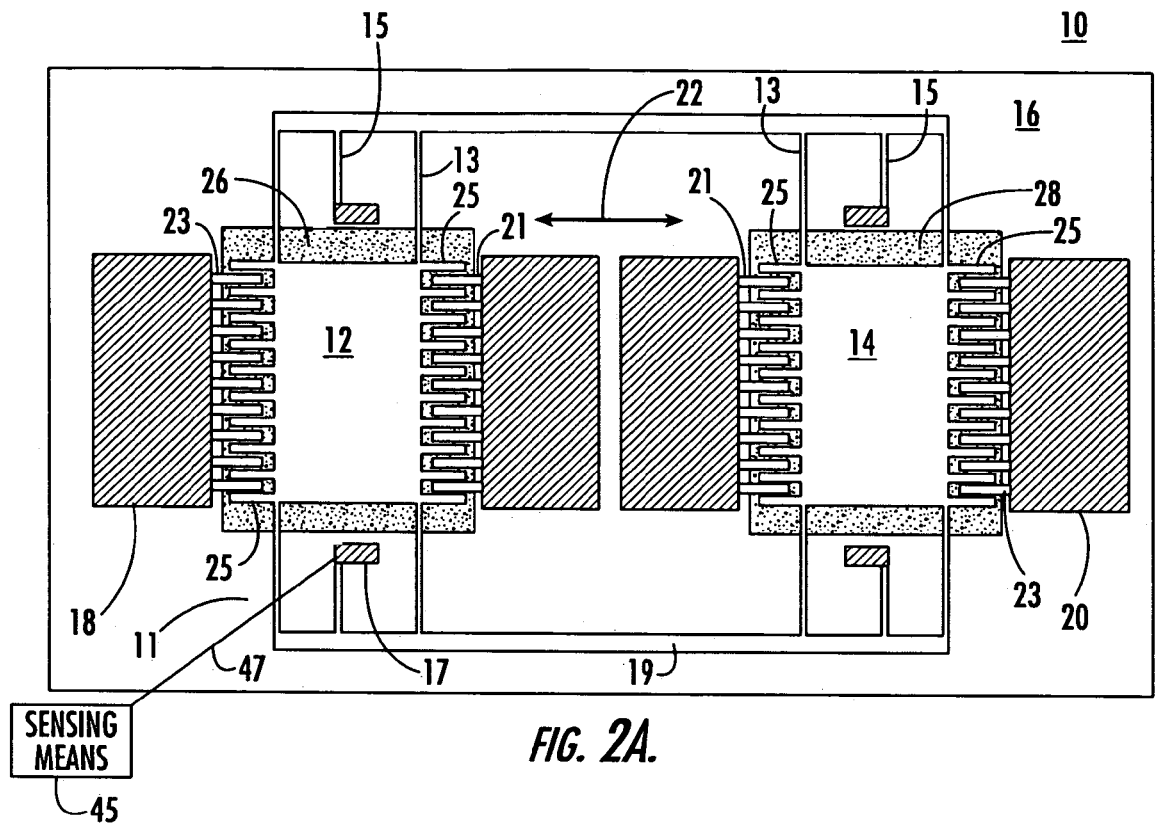
FIG. 2A is a top schematic view of the proof mass structure and the first or lower substrate of the tuning fork gyroscope in accordance with the present invention.
Figure 3:
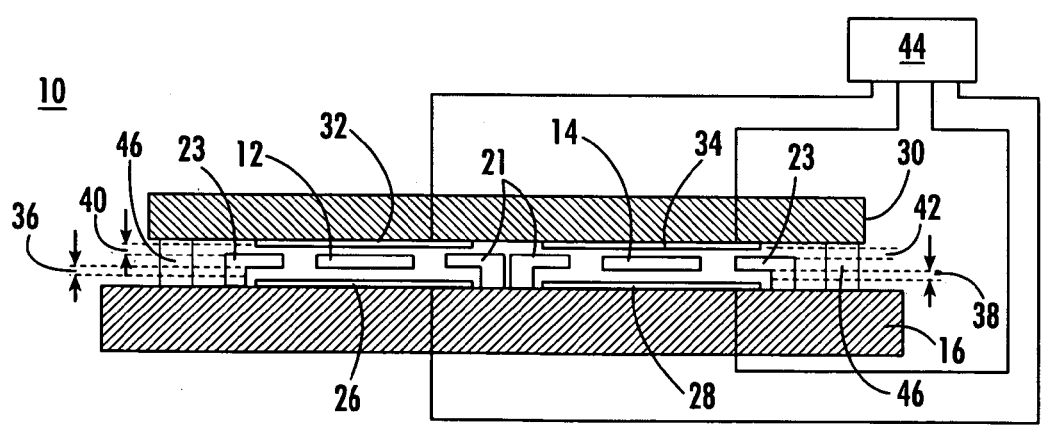
FIG. 3 is a cross-sectional schematic view of the tuning fork gyroscope showing both the upper and lower sense plates in accordance with the present invention.

Upper sense plate tuning fork gyroscope 10 in accordance with the present invention, FIGS. 2A and 3, typically includes first and second proof masses 12, 14 which are suspended with respect to first substrate 16. Comb drives 18, 20 provide means for oscillating proof masses 12, 14 along a drive axis, shown by vector 22. First and second sense plates 26, 28 are disposed under first and second proof masses 12, 14, respectively, and are supported by substrate 16. Proof masses 12, 14 are suspended above substrate 16 by a support structure 11 that includes drive beams 13, torsion beams 15, anchors 17, and base beams 19. Inner drive combs 21 and outer drive combs 23 are interleaved with driven combs 25 to provide the drive mechanism for the vibrational motion of proof masses 12, 14. Inner motor combs 21 may be vertically split, as shown in FIG. 3, or horizontally split (not shown).

Figure 2B:
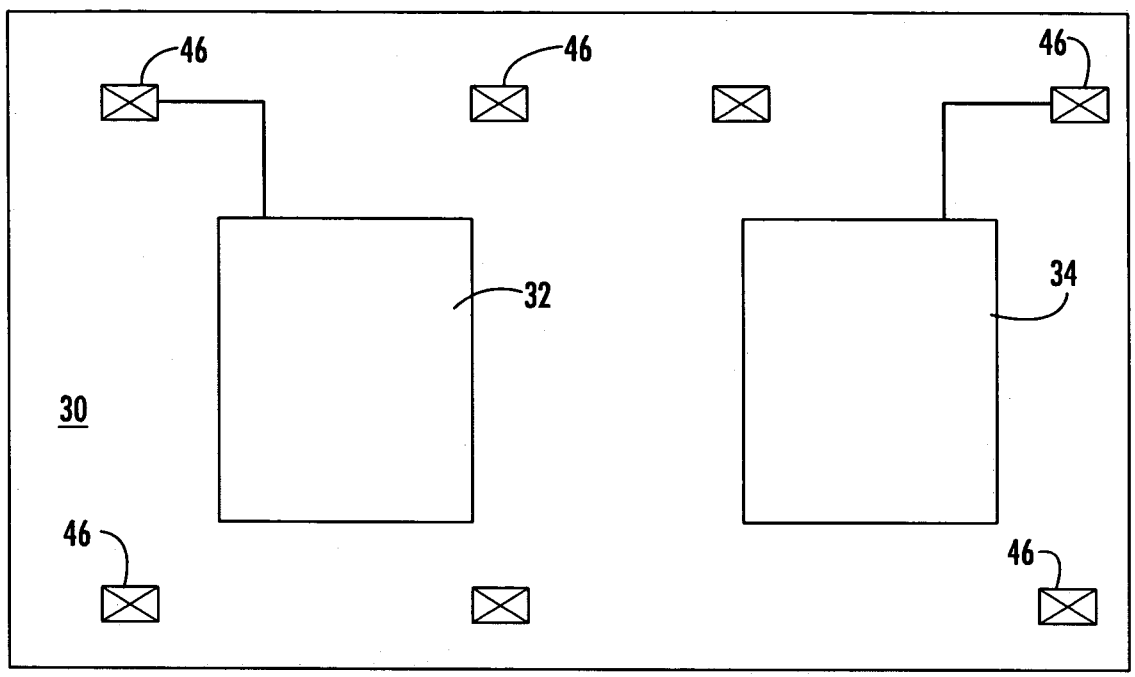
FIG. 2B is a top schematic view of the second or upper substrate and upper sense plates of the tuning fork gyroscope in accordance with the present invention.

In stark contrast with the prior art, however, third and fourth sense plates 32, 34, FIGS. 2B and 3 are disposed over proof masses 12, 14, respectively, and are supported by a second or top substrate 30. Second or top substrate 30, is disposed on the side of proof masses 12, 14 opposite first substrate 16. Support or conducting silicon posts 46 provide the spacing between substrates 16 and 30 and bring upper sense plate excitation from lower substrate 16. Sense plates 26, 28, 32, 34 are preferably made of metal, but may also be made of deposited silicon. Torsion beams 15 may include folded beam, strain relief chevron beams, or other forms known in the art.

Particularly, first nominal gap 36, FIG. 3, is defined by first sense plate 26 and first proof mass 12. Similarly, second nominal gap 38 is defined by second sense plate 28 and second proof mass 14. Third nominal gap 40 is defined by third sense plate 32 and first proof mass 12, and fourth nominal gap 42 is defined by fourth sense plate 34 and second proof mass 14.

Each of the sense plates 26, 28, 32 and 34 are interconnected to excitation source 44, e.g., a transducer. Sensing means 45 attached by lead 47 from anchor 17 senses changes in nominal gaps 36, 38, 40 and 42 and provides an output signal indicative of the angular displacement of the gyroscope. Support posts 46 may also be conductive so that the electrical connections from third and fourth sense plates 32, 34 to the first substrate 16 may be accomplished.

In operation, excitation source 44 may apply a first voltage, $V_t$, with $+V_t$ applied to sense plate 34 and $-V_t$ applied to sense plate 32, and a second voltage, $V_b$, different from but approximately equal to $V_t$, with $+V_b$ applied to sense plate 26 and $-V_b$ applied to sense plate 28. The motion generated current, which flows through the proof masses 12, 14, indicates differential proof mass motion in the sense direction. If the applied voltage is DC, a single modulation is required to obtain the estimated angular rate from the proof mass current. If an AC carrier is applied, two levels of demodulation are needed.

The advantages of the increased symmetrical design of tuning fork gyroscope 10 of this invention include: reducing scale factor sensitivity to acceleration; increasing the scale factor; reducing the bias errors; and improving the stability of the gyroscope. Moreover, sense plates 32, 34 and substrate 30 also act as a dust cover, protecting proof masses 12, 14 from contamination, and they shield inner drive combs 21 from stray electric fields emanating from outer combs 23.

With upper 32, 34 sense plates and lower 26, 28 sense plates, the scale factor is more than doubled. This results from the increased symmetry of the sense plate design. In prior art gyroscopes such as shown in FIG. 1, increasing the sense plate voltage results in the proof masses being drawn toward the sense plates. Because of the increased symmetry of gyroscope 10, FIGS. 2A, 2B and 3, the proof masses do not move as the sense plate voltages are increased. The upper sense plates increase the total plate area and result in higher (1.3 times greater) snap down voltages since the proof mass is not drawn toward the sense plates as sense voltage is increased. As noted in the Background section above, increasing the voltage applied to the prior art lower sense plates alone increases the scale factor of these instruments, but this voltage is limited by snap down. Thus, for a similar ratio of sense excitation to snap down voltage, the scale factor of a double-sided sense plate gyroscope 10 can be 2.6 times that of a single sided gyroscope 300, FIG. 1.

With upper and lower sense plates, contact potential, which increases the proof mass voltage, does not cause a sense axis signal when the proof masses are moved in a common mode along the sense axis. Thus, the effect of common mode drive-to-sense force coupling which causes a current flow from the proof mass, and which is interpreted as bias error, is reduced.

In any embodiment, the addition of the upper sense plate as described herein allows for a unique method for voltage tuning a tuning fork gyroscope to minimize the sensitivity of the gyroscope to linear acceleration. Unequal nominal gaps (such as 36, 38, 40 and 42 in FIG. 3) may arise because of the tolerances involved in the fabrication of silicon chips. Such tolerances are complex functions of internal stresses, material history, thermal expansion effects, and processing. One method which has been used previously to compensate for such unequal gaps has been the use of accelerometer outputs when available. However, not all tuning fork gyroscopes have accelerometers included, so such a method of compensation is not always possible.

Figure 4:
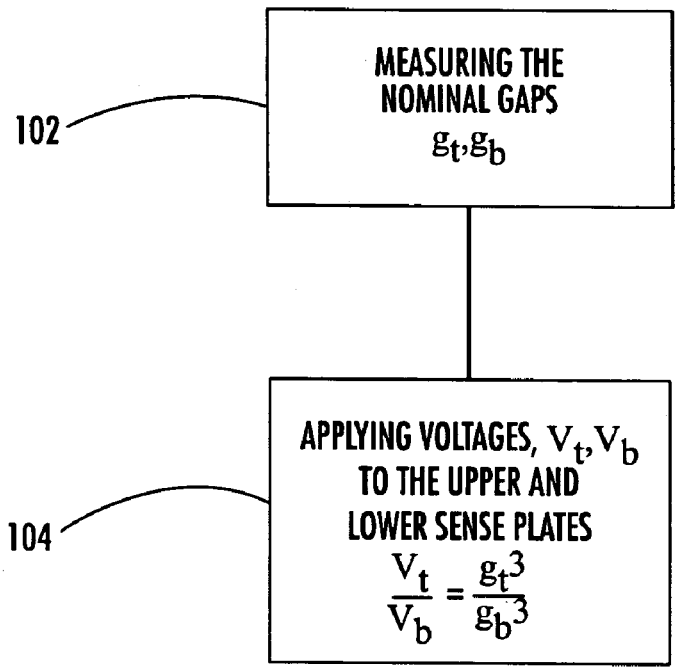
FIG. 4 is a flow chart depicting the primary steps associated with a method of reducing errors in a tuning fork gyroscope according to the subject invention.

One method of reducing the scale factor's sensitivity to acceleration, in accordance with this invention, uses the as-constructed gap distances between the upper and lower sense plates and the proof masses. When the upper left and upper right gaps are equal, and the lower left and lower right gaps are equal, measuring the gaps, step 102, FIG. 4, obtains a first distance, $g_t$, between the upper sense plates and the proof masses and a second distance, $g_b$, between the lower sense plates and the proof masses. These as-constructed gaps may be obtained, for example, by measuring the capacitance between the upper sense plates and the proof masses and between the lower sense plates and the proof masses.

Applying voltages to the upper and lower sense plates, step 104, includes applying a first voltage, $V_t$, to the upper sense plate and a second voltage, $V_b$, to the lower sense plate. The ratio of the first voltage, $V_t$, and the second voltage, $V_b$, is a function of the first and second distances, $g_t$ and $g_b$. Voltages $V_t$ and $V_b$ may be DC voltages. The invention can be extended to AC carrier excitation where two modulation steps are used—the first for the carrier frequency and the second for the drive frequencies. Preferably, in all embodiments of the present invention having more than one proof mass, positive voltages are applied to the upper right and lower left sense plates and negative voltages are applied to the upper left and lower right sense plates. This arrangement leads to the proof mass current representing the differential displacement and, hence, angular rate.

Nominal gaps 36, 38 may be equal to $g_b$ and nominal gaps 40, 42 may be equal to $g_t$. To eliminate the scale factor sensitivity to sense axis linear acceleration, the ratio of voltages $V_t$ and $V_b$ is preferably a function of the ratio of the nominal gap $g_t$ and nominal gap $g_b$. In one example, where $g_t$ is not equal to $g_b$, the ratio is:

$$V_t/V_b = g_t^3/g_b^3. \tag{1}$$

The tuning condition does not depend on resonant frequencies, mass, stiffness, or the amplitudes of drive motion. The mathematics underlying equation (1) is as follows.

The tuning fork gyroscope scale factor contains terms proportional to applied voltage and inverse gap squared:

$$SF \propto \frac{V_t}{(g_t + \Delta y)^2} + \frac{V_b}{(g_b + \Delta y)^2} \tag{A}$$

where $V_t$, $V_b$=voltages on upper and lower sense plates $g_t$, $g_b$=upper and lower sense gaps $\Delta y$=displacement caused by acceleration.

The first order Taylor series of (A) is:

$$SF \propto \frac{V_t}{g_t^2} + \frac{V_b}{g_b^2} + 2\Delta y \left( \frac{V_b}{g_b^3} - \frac{V_t}{g_t^3} \right) \tag{B}$$

To zero the first order sensitivity of scale factor to acceleration, the relative magnitudes of the upper and lower sense plate voltages must be set per:

$$\left(\frac{V_t}{V_b} = \frac{g_t^3}{g_b^3}\right) \quad (1)$$

Equation (A) also indicates how well the two gaps must be matched if the upper and lower voltages are identical. Let the upper and lower constructed gaps be indicated as:

$$g_t = g + \frac{\Delta g}{2}$$

$$g_b = g - \frac{\Delta g}{2}$$

The Taylor expansion for the scale factor (B) becomes.

$$\frac{\Delta SF/SF}{\Delta y/g} = \frac{3\Delta g}{g}$$

When the upper and lower gaps are equal ($\Delta g=0$) and the upper and lower voltage absolute values are equal, the scale factor does not change with displacements caused by acceleration ($\Delta y$). If the proof mass is displaced up 0.1 µm during construction, $\Delta g/g=0.21$ µm/3 µm and the scale factor variation is 0.15 $\Delta y/g$. With only one sense plate, the scale factor variation is 2 $\Delta y/g$.

Figure 5:
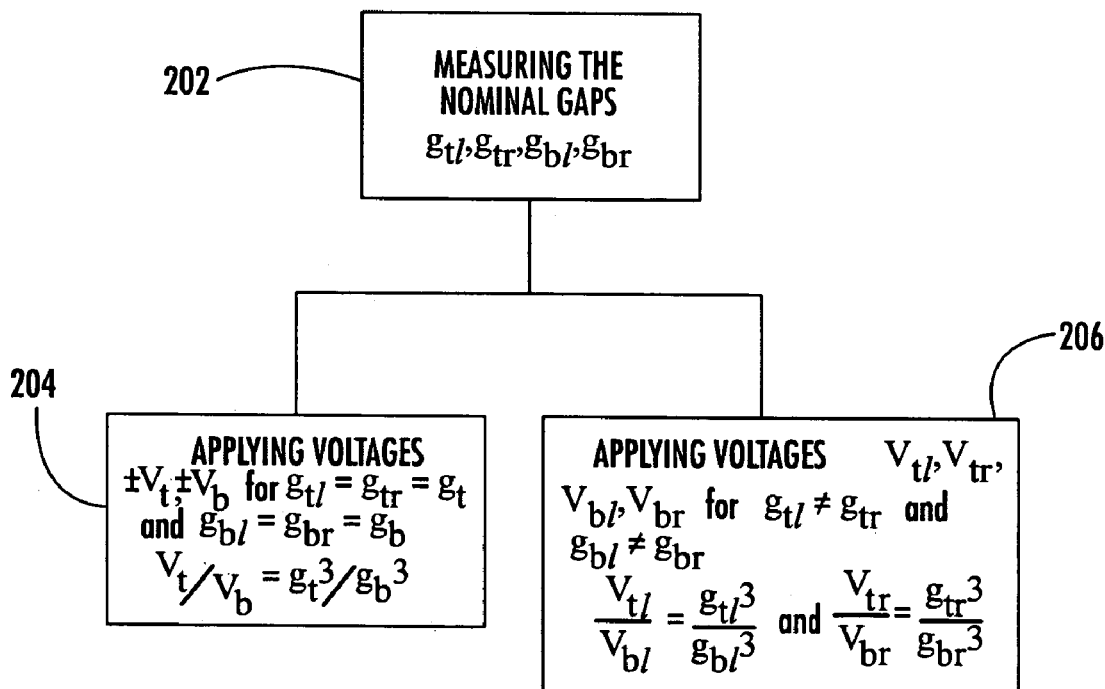
FIG. 5 is a flow chart depicting the primary steps of another method of reducing errors in a tuning fork gyroscope according to the subject invention.

In another example, as shown in step 202, FIG. 5, the distance, $g_{tl}$, between the left upper sense plate 32 and the first proof mass 12 is measured, as is the distance, $g_{tr}$, between the right upper sense plate 34 and the second proof mass 14; the distance, $g_{bl}$, between the left lower sense plate 26 and the first proof mass 12; and the distance, $g_{br}$, between the right lower sense plate 28 and the second proof mass 14. In step 204 voltage $V_t$ is applied to the left upper sense plate, voltage $-V_t$ to the right upper sense plate; voltage $-V_b$ is applied to the left lower sense plate; and voltage $V_b$ is applied to the right lower sense plate, when $g_{tl}=g_{tr}=g_t$ and $g_{bl}=g_{br}=g_b$. In this instance, the ratio of $V_t$ $V_b$ is that as shown by equation (1).

For the case where $g_{tl}$ is not equal to $g_{tr}$ and $g_{bl}$ is not equal to $g_{br}$, step 206, the voltage applied to the upper left sense plate is $V_{tl}$, the voltage applied to the upper right sense plate is $V_{tr}$, the voltage applied to the lower left sense plate is $V_{bl}$ and the voltage applied to the lower right sense plate is $V_{br}$. In this example, excitation source 44 may apply a different voltage to each sense plate 26, 28, 32 and 34, FIG. 3, i.e., $V_{bl}$ to sense plate 26, $V_{br}$ to sense plate 28, $V_{tl}$ to sense plate 32 and $V_{tr}$ to sense plate 34. In this example, nominal gap 36 is $g_{bl}$, nominal gap 38 is $g_{br}$, nominal gap 40 is $g_{tl}$ and nominal gap 42 is $g_{tr}$. The ratio of $V_{tl}$ and $V_{bl}$ is preferably a function of the ratio of $g_{tl}$ and $g_{bl}$, and the ratio of $V_{tr}$ and $V_{br}$ is preferably a function of the ratio of $g_{tr}$ and $g_{br}$. The preferred ratios are:

$$V_{tl}/V_{bl}=g_{tl}^3/g_{bl}^3 \quad (2)$$

and $$V_{tr}/V_{br}=g_{tr}^3/g_{br}^3 \quad (3)$$

As noted, in equations (1) through (3) of the present invention, the cubic relationship zeroes the scale factor sensitivity to linear acceleration along the sense axis.

There may be several designs for the arrangement of sense plates and sense axis drivers, including a single sense plate under each proof mass. The sense plates may extend under the drive and sense combs. The sense plates may be rectangular or some other shape. Guard bands beneath the motor combs may be included to control out-of-plane sensitivities of the comb drive and to allow additional configurations for the sense plates. There are various suspension designs and proof mass shapes, and various metals may be used for the sense plates and guard bands. The tuning gyroscope of the present invention may be operated open loop without torque plates, or with torque electrodes and closed loop control. The torque plate could be centered within the sense plate, which would contain an opening for the torque lead. All of these variations and others, known in the art in conjunction with tuning fork gyroscopes having only lower sense plates, may also be used with the tuning scope gyroscope of the present invention.

Also, it is known that one voltage may be applied to the proof masses and the currents that appear on the sense plates may be read. In accordance with the present invention, one voltage may be applied to the proof masses 12, 14, FIG. 3 and the output currents $I_{bl}$, $I_{br}$, $I_{tl}$, and $I_{tr}$ of four sense plates 26, 28, 32 and 34 may be read by sensing means 45, FIG. 2. In this example, nominal gap 36 is $g_{bl}$, nominal gap 38 is $g_{br}$, nominal gap 40 is $g_{tl}$, and nominal gap 42 is $g_{tr}$. The weighted summation of output currents on each of the sense plates is $I_{sum}$ where $$I_{sum} = I_{tr} - I_{tl}\left(\frac{g_{tl}}{g_{tr}}\right)^3 + I_{bl}\left(\frac{g_{bl}}{g_{tr}}\right)^3 - I_{br}\left(\frac{g_{bl}}{g_{tr}}\right)^3. \quad (4)$$

$I_{sum}$ in equation (4) is proportional to the input angular rate and does not depend on vertical displacement.

Figure 6A:
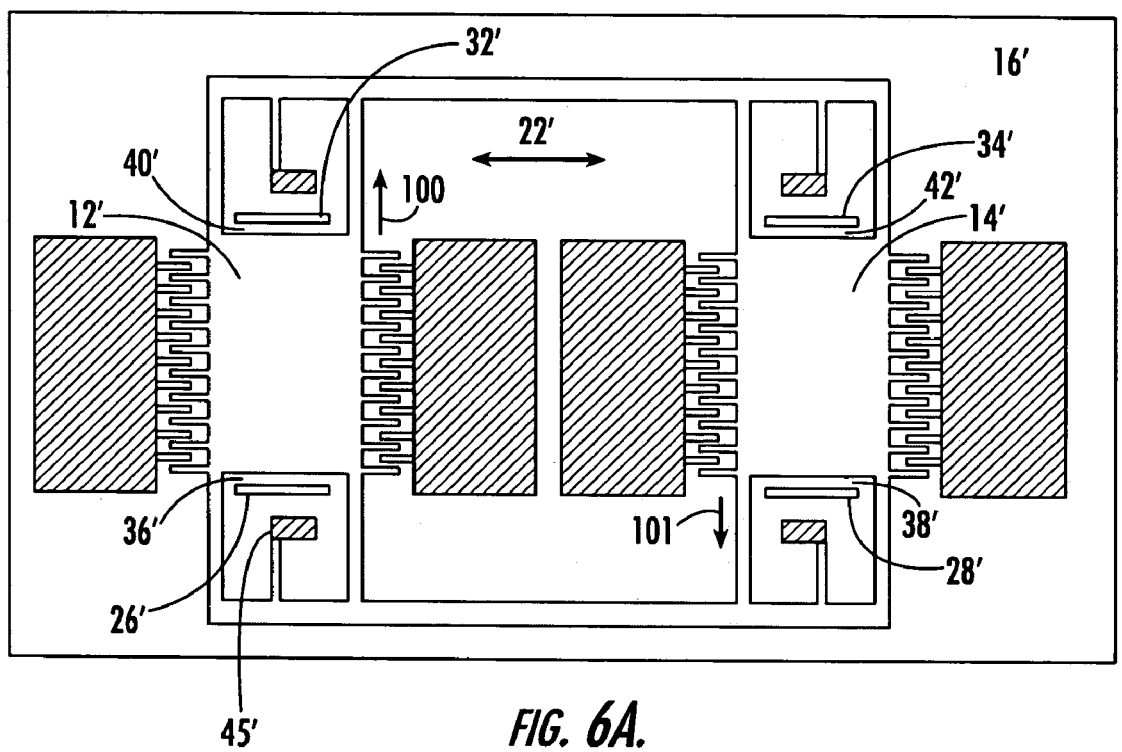
FIG. 6A is a top schematic view of the proof mass structure and the first or lower substrate of a tuning fork gyroscope in accordance with the present invention having vertical sense plates.
Figure 6B:
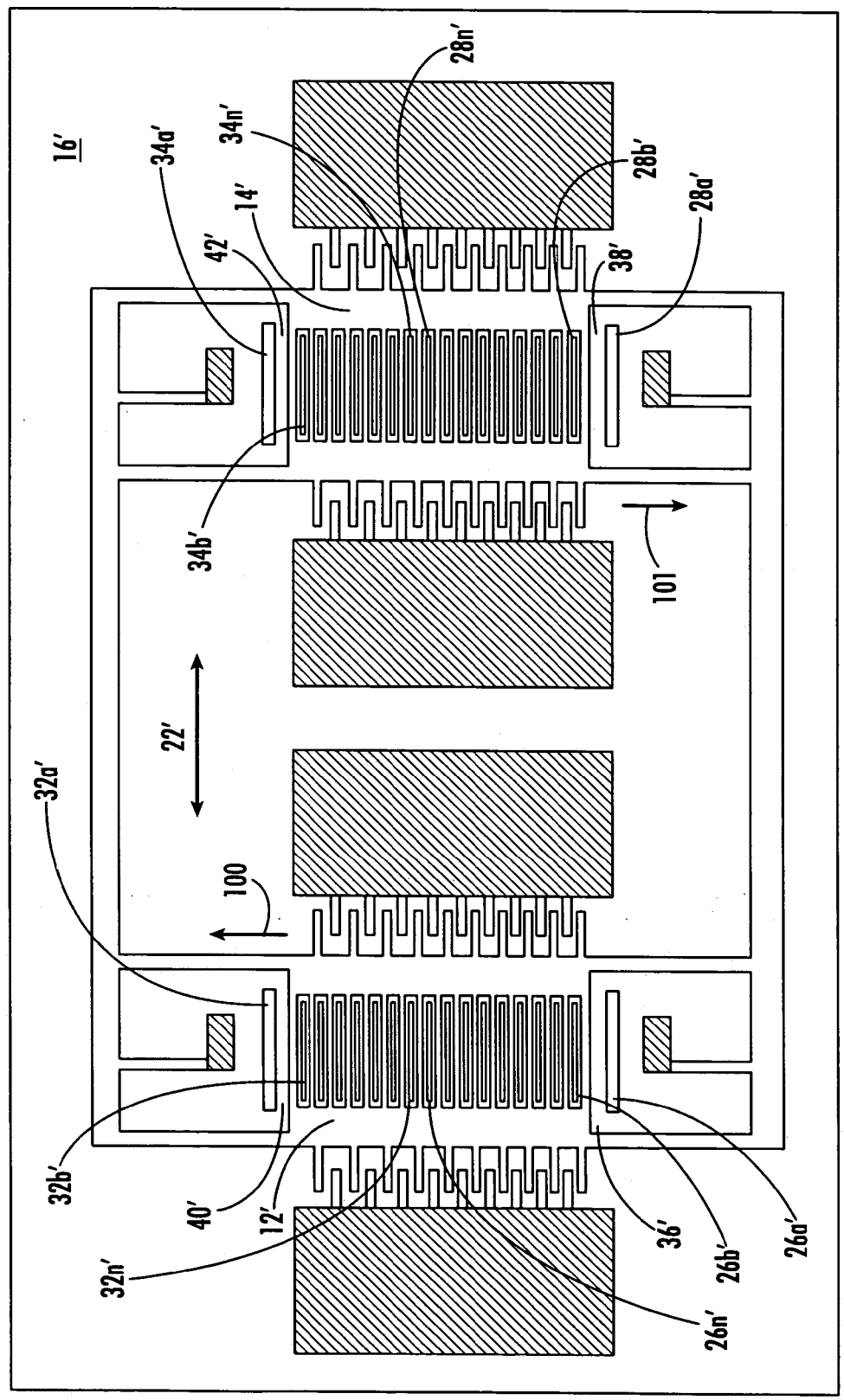
FIG. 6B is a top schematic view of the proof mass structure and the first or lower substrate of a tuning fork gyroscope in accordance with the present invention having vertical sense plates arranged as combs.

Also, it will be apparent to those skilled in the art that the gyroscope of this invention may be used to sense in-plane rotations, or to sense out-of-plane rotations, with one example of the latter described in U.S. Pat. No. 6,257,059 B1 to Weinberg et al. For the tuning fork gyroscope in accordance with this invention used to sense in-plane motion, as described above and in FIG. 2A, sense plates 26, 28, 32 and 34 are driven in the same plane as drive axis 22, and the sense axis for proof masses 12, 14 is into and out of the page, perpendicular to drive axis 22. For sensing out-of-plane motion, sense plates 26', 28', 32', 34', FIG. 6A, are perpendicular to the plane of drive axis 22' and the sense axis displacement for proof masses 12', 14' is in the direction of arrows 100, 101. Nominal gaps 36', 38' may be equal to $g_{bl}$ and $g_{br}$, nominal gaps 40', 42' may be equal to $g_{tl}$ and $g_{tr}$ in equations (2) and (3). In another embodiment, numerous sense plates, which may number in the hundreds, as shown schematically in FIG. 6B as 26a', 26b' . . . 26n, 28a', 28b' . . . 28n', 32a', 32b' . . . 32n', and 34a', 34b' . . for a larger effective sensing area.

Figure 7:
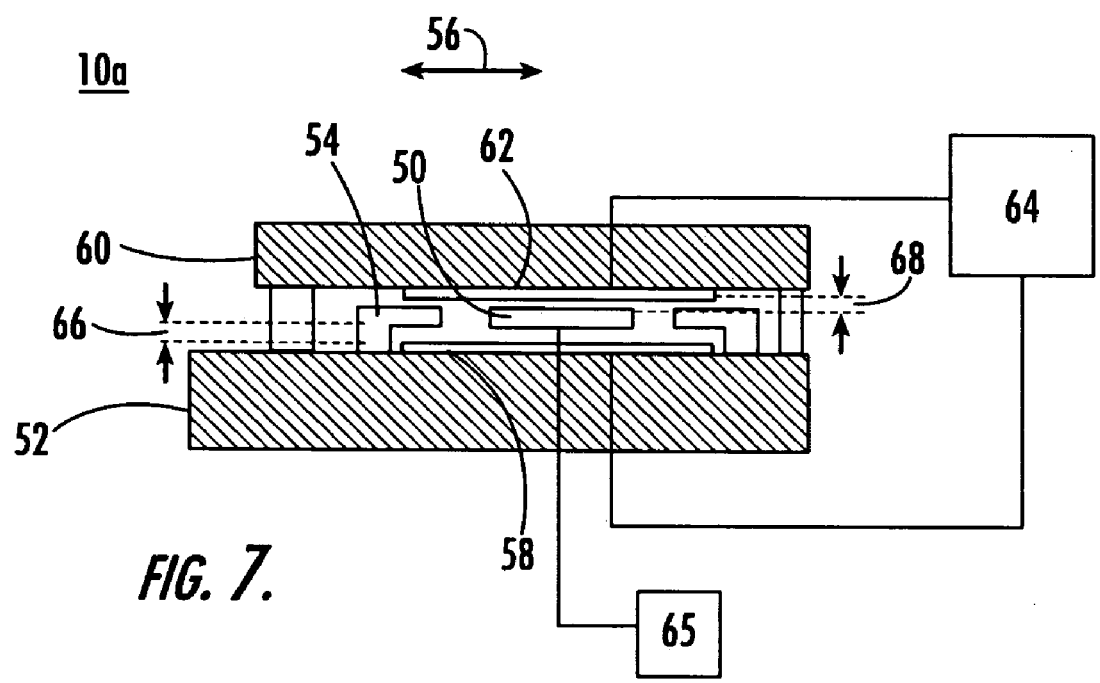
FIG. 7 is a cross-sectional schematic view of another embodiment of a tuning fork gyroscope according to the present invention having a single proof mass.

Tuning fork gyroscope 10a, FIG. 7, in accordance with this invention may include a single proof mass 50 which is suspended with respect to first substrate 52. Drive comb 54 provides means for oscillating proof mass 50 along a drive axis, shown by arrow 56. First sense electrode 58 is disposed under proof mass 50 and is supported by substrate 52. Second substrate 60 is spaced from first substrate 52. Second sense electrode 62 is disposed over proof mass 50 and is supported by substrate 60. First and second sense electrodes 58, 62 are interconnected to excitation source 64. Sensing means 65 senses changes in nominal gaps 66, 68, defined by the proof mass and sense plates 58, 62, respectively.

In operation, excitation source 64 applies a first voltage, $V_b$, to sense plate 58 and a second voltage, $V_t$, to sense plate 62. Nominal gap 66 may be equal to $g_b$, and nominal gap 68 may be equal to $g_t$. The ratio of the second voltage, $V_t$, and the first voltage, $V_b$, may be a function of the ratio of $g_t$ and $g_b$. In one example, the ratio may be that shown in equation (1).

A typical fabrication process for a single crystal tuning fork gyroscope in accordance with this invention utilizes the dissolved wafer process with either reactive (RIE) or plasma enhanced ion etching and boron diffusion or epitaxy to define the final structure. The fabrication sequence involves both silicon and glass processing, FIGS. 8A–8G.

Figure 8A:
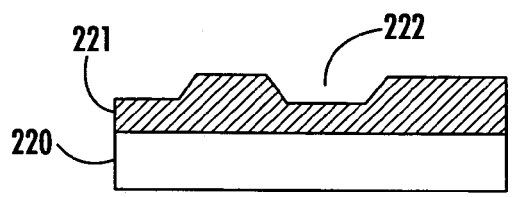
FIGS. 8A–8G are cross-sectional schematic drawings depicting the method of manufacturing the tuning fork gyroscope of the subject invention.

Processing starts with lightly doped silicon wafer or substrate 220, FIG. 8A that contains a 5 to 50 micron thick highly doped epitaxial layer 221. A recess 222 is etched into the silicon. This recess defines the gap spacing of the conducting plates. The etching may be accomplished using, for example, plasma enhanced ion etching.

The epitaxial layer 221 defines the part thickness. A structure layer 224, FIG. 8B is etched to provide at least one proof mass 250 and may be 5 to 100 µm in thickness, with a thickness of 5 to 20 µm preferred. Silicon-on-insulator or boron-geranium-silicon may be used for thicker, 10 to 100 µm thick, proof masses. The features of the structure and of the connecting posts 225 between the lower and upper plates are defined by reactive ion etching (RIE), FIG. 8C. The posts 225 also serve as electrical connections between the plates. By etching past the p++ etch stop, the structures are released. A $CF_3Br$ or $SF_6$ chemistry may be used for the etching in a parallel plate reactor or inductively-coupled plasma, which gives straight sidewalls and high aspect ratios.

Figure 8D:
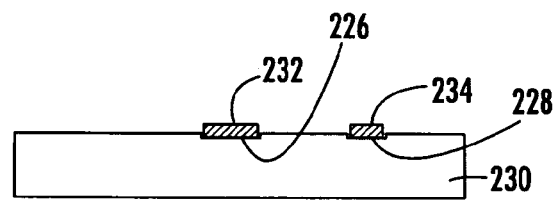
Figure 8B:
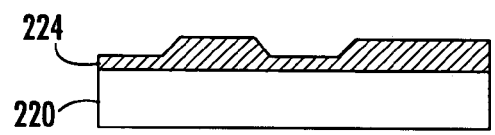

The glass processing involves forming recesses 226, 228, FIG. 8D, in glass substrate 230. Recesses 226, 228 are approximately 1700 Å deep. Glass substrate 230 may be a borosilicate glass, such as Corning 7740. Then multimetal pads 232, 234 are deposited in recesses 226, 228. Multimetal pads 232, 234 may be Ti/Pt/Au or Ti/Pt. Multimetal pads 232, 234 are deposited such that multimetal pads protrude only 500 Å above the surface of the glass substrate 230. The multimetal pads 232, 234 form the capacitor sense plates and the leads to and from the transducer.

Figure 8E:
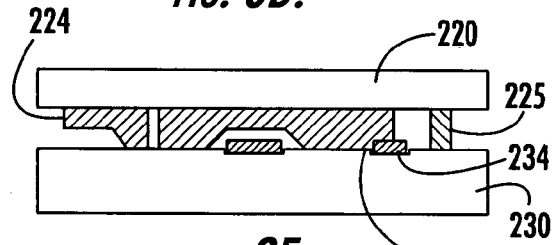
Figure 8C:
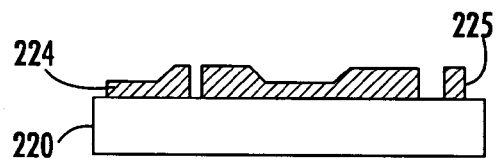
Figure 8F:
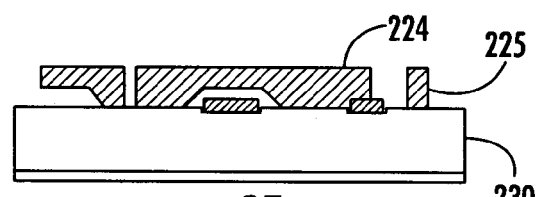

Silicon substrate 220 and glass substrate 230 are then electrostatically bonded together, FIG. 8E. The electrostatic bonding takes place at approximately 335° C. with a potential of 1000V applied between the glass and silicon. In order to make electrical contact to the silicon, a metal lead 234 on the glass is allowed to overlap the silicon rim over a small area 236. During the electrostatic bonding process, the silicon and glass are drawn tightly together, a process which insures a low resistance silicon to metal (such as gold or platinum) contact. KOH thinning may be applied. The final step is a selective etch in ethylene diamine pyrocatechol (EDP), which dissolves the silicon substrate 220 and stops on the heavily doped diffused layer 224, FIG. 8F.

Figure 8G:
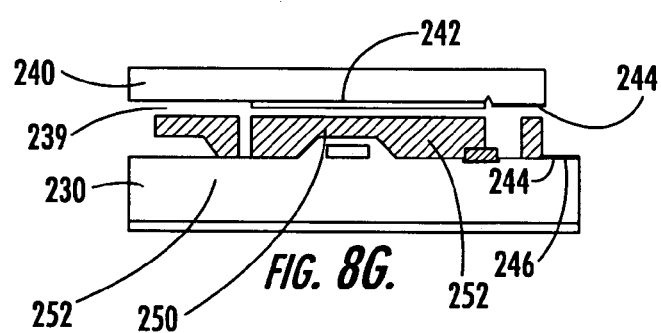

Indentations 239, which form the upper sense gap, are etched into a second glass wafer 240 or substrate and sense plate metal 242 and metal runs 244 are deposited, FIG. 8G. It will be understood by those skilled in the art that cutting the gap 239 between proof mass 250 and the substrate 240 may include cutting into the silicon or cutting into the glass. Second glass wafer 240 is water drilled to expose the bonding pads 246, which may be made of metal or deposited silicon, on the lower sense plates. The second glass wafer 240 is electrostatically bonded to the silicon structure layer. The voltages and temperatures are similar to those used in bonding the first glass. For the second bond, the proof masses 250 are supported only by their suspension arms 252 and not by the bulk silicon wafer. Therefore, additional leads, which are later removed in dicing, maintain both the sense plates and the proof masses at one potential. These connections avoid electrostatic attraction and subsequent sticking.

It will be understood that the terms upper and lower as used herein are relative terms only and are not meant to limit the invention to sense plates that are higher or lower, but would also include any arrangement of sense plates wherein there are sense plates on opposite sides of a proof mass.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A method for fabricating a tuning fork gyroscope with upper and lower sense plates, the method comprising:
   providing a silicon substrate;
   etching the silicon substrate to provide at least one recess in the silicon substrate;
   producing a structure layer having a predetermined thickness;
   etching the structure layer to provide at least one proof mass;
   applying a metal coating to the silicon substrate beneath a portion of each proof mass;
   providing a glass substrate;
   etching the glass substrate to provide at least one recess in the glass substrate;
   depositing a multimetal layer to the at least one recess;
   electrostatically bonding the silicon substrate to the glass substrate; and
   etching the silicon substrate down to the structure layer.

2. The method of claim 1 wherein the proof masses have a thickness in the range of 5 to 100 µm.

3. The method of claim 1 wherein the multimetal layer is chosen from the group consisting of Ti/Pt/Au and Ti/Pt.

4. The method of claim 1 in which producing a structure layer includes diffusing boron onto a surface of the silicon substrate.

5. The method of claim 4 in which diffusing boron onto a surface of the silicon substrate includes diffusing boron-geranium silicon to define structural thickness.

6. The method of claim 1 in which producing a structure layer includes growing epitaxial silicon with boron onto a surface of the silicon substrate to define structural thickness.

7. The method of claim 4 in which boron is diffused into a silicon substrate to define structural thickness.

8. The method of claim 4 including the further step of applying KOH thinning prior to etching the silicon substrate.

9. The method of claim 4 in which diffusing boron onto a surface of the silicon substrate includes diffusing silicon-on-insulator to define structural thickness.

10. The method of claim 1 wherein the silicon substrate includes a lightly doped layer and a highly doped epitaxial layer.

11. The method of claim 10 wherein the thickness of said highly doped epitaxial layer is between 5 and 100 μm thick.

12. The method of claim 1 wherein the etching of the silicon substrate is plasma enhanced ion etching.

13. The method of claim 1 wherein the structure layer is 5 to 100 μm thick.

14. The method of claim 1 wherein the structure layer is 5 to 20 μm thick.

15. The method of claim 1 wherein connecting posts between the silicon substrate and the glass substrate are defined by reactive ion etching.

16. The method of claim 1 wherein the recesses in the glass substrate are approximately 1700 Å deep.

17. The method of claim 1 further including:

providing a second glass substrate;

etching said second glass substrate to provide at least one indentation in the second glass substrate;

depositing at least one metal run in said at least one indentation in the second glass substrate;

cutting a gap between said at least one proof mass and said second glass substrate;

exposing at least one bonding pad; and bonding said second glass substrate to said structure layer.

18. The method of claim 1 wherein exposing at least one bonding pad includes water drilling.

* * * * *